United States Patent [19]

Vermeersch et al.

[11] Patent Number: 5,714,300
[45] Date of Patent: Feb. 3, 1998

[54] DIAZO BASED IMAGING ELEMENT HAVING IMPROVED STORAGE STABILITY

[75] Inventors: Joan Vermeersch, Deinze; Dirk Kokkelenberg, St. Niklaas; Guido Hauquier, Nijlen, all of Belgium

[73] Assignee: Agfa-Gevaert, N.V., Mortsel, Belgium

[21] Appl. No.: 593,355

[22] Filed: Jan. 29, 1996

[30] Foreign Application Priority Data

Feb. 15, 1995 [EP] European Pat. Off. ............ 95200362

[51] Int. Cl.$^6$ ................ G03F 7/021; G03C 1/93
[52] U.S. Cl. ............ 430/159; 430/160; 430/175; 430/176; 430/272.1; 430/302
[58] Field of Search ................ 430/159, 157, 430/160, 175, 176, 272, 278, 320, 302

[56] References Cited

U.S. PATENT DOCUMENTS

| | | | |
|---|---|---|---|
| 3,790,385 | 2/1974 | Steppan et al. | 430/159 |
| 4,469,772 | 9/1984 | Barton et al. | 430/175 |
| 4,533,620 | 8/1985 | Wall et al. | 430/175 |
| 4,578,342 | 3/1986 | Sekiya | 430/159 |
| 4,579,811 | 4/1986 | Schell et al. | 430/302 |
| 4,618,562 | 10/1986 | Walls et al. | 430/160 |
| 4,983,491 | 1/1991 | Aoai et al. | 430/175 |
| 5,300,397 | 4/1994 | Aoshima | 430/175 |
| 5,403,694 | 4/1995 | Vermeersch et al. | 430/159 |
| 5,445,912 | 8/1995 | Hauquier et al. | 430/159 |
| 5,462,833 | 10/1995 | Hauquier et al. | 430/159 |

*Primary Examiner*—John S. Chu
*Attorney, Agent, or Firm*—Breiner & Breiner

[57] ABSTRACT

The present invention provides an imaging element comprising on a support a hydrophilic layer containing a hydrophilic (co)polymer or (co)polymer mixture and having been hardened with a hydrolysed tetraalkyl orthosilicate and a light sensitive layer containing a diazo resin and/or a diazonium salt characterized in that the light sensitive layer comprises at least one diazo resin or diazonium salt containing or being a diazonium salt of p-aminodiphenylamine containing as substituent an alkyl or alkoxy group and the weight percentage of said diazonium salt(s) and/or diazo resin(s) containing or being a diazonium salt of p-aminodiphenylamine containing as substituent an alkyl or alkoxy group versus the total amount of diazo resin and/or diazonium salt ranges from 22 to 40%.

10 Claims, No Drawings

1

DIAZO BASED IMAGING ELEMENT HAVING IMPROVED STORAGE STABILITY

1. FIELD OF THE INVENTION

The present invention relates to a diazo sensitized imaging element which is developable by plain water to a lithographic printing plate.

2. BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers.

Particularly diazo-sensitized systems are widely used. These systems have been extensively reviewed by Kosar J. in "Light-Sensitive Systems", Wiley, New York, 1965, Chapter 7. A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts whose photolysis products can harden polymers (natural colloids or synthetic resins) directly and diazonium polymers. Although polymers containing diazonium groups have a large structure they remain water soluble owing to the presence of the ionic diazonium groups. When these groups are destroyed by exposure to light an insoluble resin is formed. Particularly useful diazonium polymers are the condensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

Several types of supports can be used for the manufacturing of a diazo-sensitized lithographic printing plate. Common supports are metal supports like Al or Zn, polyester film supports and paper bases. These supports, if not sufficient hydrophilic by themselves, are first coated with a hydrophilic layer to form the hydrophilic background of the printing plate and a top layer containing the diazo compound is then applied (see for example DE-P-1900469, DE-P-2030634 and U.S. Pat. No. 3,971,660).

It is known to use as hydrophilic layer in these systems a layer containing polyvinyl alcohol and hydrolyzed tetraethyl orthosilicate and preferably also silicium dioxide and/or titanium dioxide as described in e.g. GB-P-1419512, FR-P-2300354, U.S. Pat. Nos. 3,971,660 and 4,284,705. This hydrophilic layer is overcoated with a light-sensitive layer containing a diazonium salt or a diazo resin in a polymeric binder.

Upon image-wise exposure of the light-sensitive layer the exposed image areas become water insoluble and the unexposed areas remain water soluble. The plate is then developed with water to remove the diazonium salt or diazo resin in the unexposed areas. Such development may take place by means of plain water as disclosed in e.g. EP-A-450199 and EP-A-601240.

It has however been found that the lithographic properties of a lithographic printing plate obtained from diazo based imaging elements comprising as hydrophilic layer a layer containing a hydrophilic (co)polymer or (co)polymer mixture and hydrolyzed tetraethyl orthosilicate as disclosed in e.g. EP-A-450199, EP-A-601240 and U.S. Pat. No. 3,971,660 decrease upon storage of the imaging element.

3. SUMMARY OF THE INVENTION

It is an object of the present invention to provide a diazo based imaging element comprising as hydrophilic layer a layer containing a hydrophilic (co)polymer or (co)polymer mixture and hydrolyzed tetraethyl orthosilicate for producing a lithographic printing plate having an improved storage stability and a high printing endurance.

Other objects will become apparent from the description hereinafter.

According to the present invention there is provided an imaging element comprising on a support in the order given a hydrophilic layer containing a hydrophilic (co)polymer or (co)polymer mixture and having been hardened with a hydrolysed tetraalkyl orthosilicate and a light sensitive layer containing a diazo resin and/or a diazonium salt characterized in that the light sensitive layer comprises at least one diazo resin or diazonium salt containing or being a diazonium salt of p-aminodiphenylamine containing as substituent an alkyl or alkoxy group and the weight percentage of said diazonium salt(s) and/or diazo resin(s) containing or being a diazonium salt of p-aminodiphenylamine containing as substituent an alkyl or alkoxy group versus the total amount of diazo resin and/or diazonium salt ranges from 22 to 40%.

According to the present invention there is provided a method for obtaining a lithographic printing plate comprising the steps of image-wise exposing an imaging element as defined above and subsequently removing the light sensitive layer in the non-exposed or insufficiently exposed areas of said imaging element by means of rinsing or washing said imaging element with an aqueous liquid.

4. DETAILED DESCRIPTION

By using in the imaging element in accordance with the present invention a light sensitive layer comprising at least one diazo resin or diazonium salt containing or being a diazonium salt of a p-aminodiphenylamine containing as substituent an alkyl or alkoxy group and the weight percentage of said diazonium salt(s) and/or diazo resin(s) containing or being a diazonium salt of p-aminodiphenylamine containing as substituent an alkyl or alkoxy group versus the total amount of diazo resin and/or diazonium salt ranging between 22 and 40% the developability and the lithographic properties such as ink repellance by the non-printing areas remain much more stable upon storage of the imaging element before imaging.

A percentage above 40% results in a lower printing endurance and a percentage above 60% results in addition in a non-acceptable decrease of sensitivity.

Preferably said substituent contains from 1 to 4 carbon atoms, more preferably 1 or 2 carbon atoms. Still more preferably said substituent is an alkoxy group. Particularly preferably said diazo resin or diazonium salt containing or being a diazonium salt of p-aminodiphenylamine containing as substituent an alkyl or alkoxy group is a 3-methoxy-diphenylamine-4-diazonium salt. Most preferably said diazo resin or diazonium salt containing or being a diazonium salt of p-aminodiphenylamine containing as substituent an alkyl or alkoxy group is a salt of the condensation product of formaldehyde with a 3-methoxy-diphenylamine-4-diazonium salt. This diazo resin is prepared by condensation of formaldehyde with a methoxy-diphenylamine-4-diazonium salt in a strongly acid medium.

Preferably said diazonium salts or diazo resins comprise as anion an acid rest of sulfuric acid. More preferably they also contain as complexant zinc chloride.

The weight percentage of said diazonium salts and/or diazo resins versus the total amount of diazo resin and/or diazonium salt ranges preferably between 25% and 35%.

The light sensitive layer of an imaging element in connection with the present invention preferably also contains a hydrophilic binder. A suitable hydrophilic binder is for example pullulan.

Pullulan is a polysacharide that is produced by microorganisms of the *Aureobasidium pullulans* type (*Pullularia pullulans*) and that contains maltotriose repeating units connected by a α-1,6 glycosidic bond. Pullulan is generally produced on industrial scale by fermentation of partially hydrolysed starch or by bacterial fermentation of sucrose. Pullulan is commmercially available from e.g. Shodex, Pharmacosmos.

Alternatively the light sensitive layer may contain polyvinylacetate hydrolysed to an extent of at least 95% by weight as a binder.

Preferably the light sensitive layer further includes a cationic fluor containing surfactant, preferably a perfluorinated surfactant and more preferably a perfluorinated ammonium surfactant. Typical examples of perfluorinated ammonium surfactants are:

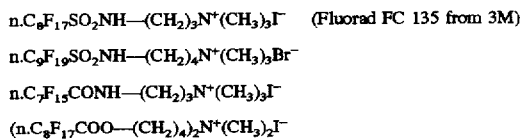

The light sensitive layer according to the present invention preferably also contains dispersed water-insoluble polymers. Said aqueous dispersion of water insoluble polymer is preferably cationic or nonionic either e.g. as a result of an emulsifier or by having the cationic or nonionic group linked to the polymer. The water insoluble polymer is preferably a solid particulate having a size in the range of about 100 Angstroms to 1 micron in diameter and does not form a film below 30° C. In general, any polymer which carries a cationic or nonionic group or which can be formulated into an emulsion using a cationic or nonionic emulsifier can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, maleic anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyoles.

The thickness of the light-sensitive layer in the material of this invention may vary in the range from 0.1 to 10 μm and is preferably between 0.5 and 2.5 μm.

Suitable supports that can be used in an imaging element in accordance with the present invention are e.g. photographic film bases e.g. substrated polyethylene terephthalate film, cellulose acetate film, plastics having a metal layer or deposit thereon, and polyolefin (e.g. polyethylene) coated paper, the polyolefin surface of which may have been subjected to a corona discharge to improve the adherence of a hydrophilic layer.

As hydrophilic (co)polymers in the hydrophilic layer of an imaging element in connection with the present invention one may use, for example, homopolymers and copolymers of vinyl alcohol, acrylamide, methylol acrylamide, methylol methacrylamide, hydroxyethyl acrylate or hydroxyethyl methacrylate. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight. Most preferably polyvinyl alcohol hydrolyzed to at least an extent of 80 percent by weight is used in the hydrophilic layers in connection with the present invention.

Examples of hydrolyzed tetraalkyl orthosilicate crosslinking agents are hydrolyzed tetraethyl orthosilicate and hydrolyzed tetramethyl orthosilicate.

Said hydrophilic layer in an imaging element used in accordance with the present invention preferably also contain substances that increase the mechanical strength and the porosity of the layers. For this purpose colloidal silica may be used. The colloidal silica employed may be in the form of any commercially available water-dispersion of colloidal silica for example having an average particle size upto 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the package of hydrophilic layers is given a uniform rough texture consisting of microscopic hills and valleys, which serve as storage places for water in background areas.

The thickness of a hydrophilic layer in a material according to this invention may vary in the range from 0.2 to 25 μm, preferably in the range from 1 to 10 μm.

One or more subbing layers may be coated between the support and the hydrophilic layer for use in accordance with the present invention in order to get an improved adhesion between these two layers.

A preferred subbing layer for use in connection with the present invention is a subbing layer comprising a hydrophilic binder and silica.

As hydrophilic binder in said subbing layer usually a protein, preferably gelatin may be used. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

A preferred silica in said subbing layer is a siliciumdioxide of the anionic type. The colloidal silica preferably has a surface area of at least 100 m² per gram, more preferably a surface area of at least 300 m² per gram.

The surface area of the colloidal silica is determined according to the BET-value method described by S. Brunauer, P. H. Emmett and E. Teller, J. Amer. Chem. Soc. 60, 309–312 (1938).

The silica dispersion may also contains other substances, e.g. aluminium salts, stabilising agents, biocides etc.

Such types of silica are sold under the name KIESELSOL 100, KIESELSOL 300 and KIESELSOL 500 (KIESELSOL is a registered trade name of Farbenfabriken Bayer AG, Leverkusen, West-Germany whereby the number indicates the surface area in m² per gram).

The weight ratio of the hydrophilic binder to silica in the subbing layer is preferably less than 1. The lower limit is not very important but is preferably at least 0.2. The weight ratio of the hydrophilic binder to silica is more preferably between 0.25 and 0.5.

The coverage of said subbing layer is preferably more than 200 mg per m² but less than 750 mg per m², more preferably between 250 mg per m² and 500 mg per m².

The coating of the above defined subbing layer composition preferably proceeds from an aqueous colloidal dispersion optionally in the presence of a surface-active agent.

According to a preferred embodiment in connection with the present invention there is provided an intermediate layer of an organic compound having cationic groups between the hydrophilic layer and the light sensitive layer. As a consequence the development by plain water of such a diazo based imaging element is improved.

Organic compounds having cationic groups for use in an intermediate layer are preferably hydrophilic and may be low moleculair weight compounds but are preferably polymers. Preferred compounds are those having one or more ammonium groups or amino groups that can be converted to ammonium groups in an acidic medium. An especially preferred type of cationic compounds are polysacharides modified with one or more groups containing an ammonium or amino group.

Most preferred organic compounds having cationic groups are dextrans or pullulan wherein at least some of the hydroxy groups of the dextran or pullulan has been modified into one or more of the following groups:

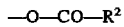

wherein $R^1$ represents an organic residue containing an amino or ammonium group, e.g. an amine substituted alkyl, an amine substituted alkylaryl etc.

$R^2$ has one of the significances given for $R^1$ or stands for $-OR^3$ or $-N(R^4)R^5$, wherein $R^3$ has one of the significances given for $R^1$ and each of $R^4$ and $R^5$ which may be the same or different have one of the significances given for $R^1$.

Examples of dextrans or pullulan that can be used in accordance with the present invention are dextrans or pullulan wherein some of the hydroxyl groups have been modified in one of the groups shown in table 1.

TABLE 1

| no. | modified group |
|---|---|
| 1 | $-O-CH_2-CH_2-NH_2$ |
| 2 | $-O-CO-NH-CH_2-CH_2-NH_2$ |
| 3 | $-O-CO-NH-CH_2-CH_2-N(CH_2-CH_2-NH_2)_2$ |
| 4 | $-O-CH_2-CH_2-NH-CH_2-CH_2-NH_2$ |
| 5 | $-O-CH_2-CH_2-NH-CH_2-CHOH-CH_2-N^+(CH_3)_3Cl^-$ |
| 6 | $-O-(CH_2-CH_2-O)_n-CH_2-CH_2-NH_2$ |
|   | wherein n represents an integer from 1 to 50 |
| 7 | $-O-CO-NH-CH_2-CH_2-NH-CH_2-CHOH-CH_2-N^+(CH_3)_3Cl^-$ |
| 8 | $-O-CH_2-CH_2-N(CH_3-CH_3)_2.HCl$ |
| 9 | $-O-CH_2-CH_2-N(CH_2-CH_2-NH_2)_2$ |
| 10 | $-O-CONH-CH_2-CH_2-N(CH_2-CH_2-NH_2)_2$ |
| 11 | $-O-CONH-(CH_2-CH_2-O)_n-CH_2-CH_2-NH_2$ |

The modified dextrans or pullulan can be prepared by a reaction of a dextran with e.g. alkylating agents, chloroformates, acid halides, carboxylic acids etc.

An intermediate layer containing the organic compound having one or more cationic groups is preferably provided in an amount of 5 to 500 mg/m² and more preferably in an amount of 10 to 200 mg/m².

The imaging element in connection with the present invention advantageously contains water-soluble dyes such as rhodamines, sudan blue, methylen blue, eosin or trifenylmethane dyes such as crystal violet, victoria pure blue, malachite green, methylviolet and fuchsin or dye pigments. These colorants may be incorporated in the light sensitive layer and/or hardened hydrophilic layers.

To obtain a lithographic printing plate from an imaging element according to the invention said imaging element is image-wise exposed and subsequently rinsed or washed with an aqueous liquid, preferably plain water to remove diazo resin or diazonium salts in the non-exposed or insufficiently exposed parts of the imaging element.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is preferably exposed in such a way that the image obtained thereon is right reading. The exposure may be an exposure using optics or a contact exposure.

The diazo resin or diazoniuan salts are converted upon exposure from water soluble to water insoluble (due to the destruction of the diazonium groups) and additionally the photolysis products of the diazo may induce an advancement in the level of crosslinking of the polymeric binder or diazo resin, thereby selectively converting the surface, in an image pattern, from water soluble to water insoluble. The unexposed areas remain unchanged, i.e. water soluble.

The following examples illustrate the present invention without being limited thereto. The percentages given are by weight unless otherwise stated.

EXAMPLE 1

Preparation of a lithographic base

To 440 g of a dispersion contg. 21.5% $TiO_2$ (average particle size 0.3 to 0.5 um) and 2.5% polyvinyl alcohol in deionized water were subsequently added, while stirring, 250 g of a 5% polyvinyl alcohol solution in water, 105 g of a hydrolyzed 22% tetramethylorthosilicate emulsion in water and 12 g of a 10%.
solution of a wetting agent.
To this mixture was added 193 g of deionized water and the pH was adjusted to pH=4.

The obtained dispersion was coated on a polyethyleneterephthalate film support having a thickness of 275 µm (382 g/$m^2$) (coated with a hydrophilic adhesion layer) to a wet coating thickness of 50 g/$m^2$, dried at 30° C. and subsequently hardened by subjecting it to a temperature of 57° C. for 1 week.

To this base was further provided an aqueous solution (pH=5) of Dormacid (a dextran modified with a diethylaminoethylgroup available from Pfeifer & Langen) and a cationic wetting agent to a dry coating thickness of 30 mg Dormacid per $m^2$.

The obtained element was then heated for 1 week at 57° C.

Preparation of the imaging element 1
  Preparation of the light sensitive coating:

To 63 g of a 20% dispersion of polymethylmethacrylate (particle diameter of 40 nm) stabilized with cetyltrimethylammoniumbromide in deionized water was subsequently added, while stirring, 120 g of a 5% solution of a 98% hydrolysed polyvinyl acetate (POLYVIOL W48/20 available from Wacker) in water and 15 g of a 10% dispersion of HELIOGEN BLUE (BASF) in water. 66 g of a 15% solution of NEGALUX N 11 (the condensationproduct of p-diphenylamine diazonium hydrogensulfate salt and formaldehyde in water, sold by PCAS) was then slowly added. Finally 30 g of a 1.6% solution of cationic fluor containing surfactant (Fluorad FC135 available from 3M) in water, and 726 ml of water were added.

Imaging element 1 was produced by coating the above described light sensitive composition to the above described lithographic base in an amount of 35 g/$m^2$ (wet coating amount) and drying it at 30° C.

Imaging elements 2, 3 and 4 were prepared in an identical way as imaging element 1 with the exception that the diazo resin NEGALUX N 11 was replaced for 10% (imaging element 2), for 20% (imaging element 3) and for 25% (imaging element 4) by weight of DIAZO No 8 (the condensationproduct of 3-methoxy-diphenylamine-4-diazonium hydrogensulfate salt and formaldehyde in water, sold by Fairmount).

The obtained imaging elements were conditioned at 25° C. at 40% relative humidity for 24 hours and two strips of the respective imaging elements under these conditions packaged in a closed aluminium bag being impermeable for water. The packages were then stored for various times at 57° C.

The imaging elements were each exposed to a high pressure halogen mercury vapour lamp of 1000 W at a distance of 70 cm for 90 seconds.

Subsequently the imaging elements were developed by rinsing with plain water. The obtained results are shown in table 2.

TABLE 2

| Material | Storage conditions | Dev.[a] | Fog[b] |
|---|---|---|---|
| 1 | fresh | 2 | 11 |
|   | 2d 57° C. | 5 | 5 |
|   | 3d 57° C. | 13 | 0 |
| 2 | fresh | 2 | 11 |
|   | 2d 57° C. | 5 | 6,5 |
|   | 3d 57° C. | 13 | 0 |
| 3 | fresh | 2 | 11 |
|   | 2d 57° C. | 4,5 | 8 |
|   | 3d 57° C. | 13 | 0 |
| 4 | fresh | 2 | 11 |
|   | 2d 57° C. | 4 | 9 |
|   | 3d 57° C. | 7 | 8 |

[a]Dev.: Developability expressed as the last step of a step wedge whereby after development the photosensitive layer is not completely removed from the plate. The number 13 indicates that even in a non-irradiated area of the plate the imaging element the photosensitive layer cannot be removed from the plate by development.
[b]Fog: is a relative evaluation whereby a number 11 indicates that the plate is completely free of fog and a number 0 indicates a complete and heavy fog whereby a number ranging from 11 to 6 indicates an acceptable fog.

Evaluation:

It is clear that imaging elements 1, 2 and 3 (comparative elements) show low storage stability. After keeping them for 3 days at 57° C., they can not more be developed what means that no more image can be formed on the plate after image-wise exposure and development with plain water, the plate being completely and heavily fogged. On the other hand, imaging element 4 (imaging element according to the invention) after keeping it for 3 days at 57° C. shows only a moderate loss in developability and a very acceptable level of fog.

EXAMPLE 2

Imaging element 1 was prepared, stored, exposed and developed as described in example 1.

Imaging elements 5, 6 and 7 were prepared, stored, exposed and developed in an identical way as imaging element 1 with the exception that the diazo resin NEGALUX N 11 was replaced for 30% (imaging element 5), for 35% (imaging element 6) and foam 40% (imaging element 7) by weight of DIAZO No 8. The obtained results are shown in table 3.

TABLE 3

| Material | Storage conditions | Dev.[a] | Fog[b] |
|---|---|---|---|
| 1 | fresh | 2 | 11 |
|   | 2,5d 57° C. | 6 | 7 |
|   | 3d 57° C. | 13 | 0 |
| 5 | fresh | 2 | 11 |
|   | 3d 57° C. | 4 | 11 |
|   | 4d 57° C. | 6 | 11 |
| 6 | fresh | 2 | 11 |
|   | 3d 57° C. | 4,5 | 11 |
|   | 4d 57° C. | 5 | 11 |
| 7 | fresh | 2 | 11 |
|   | 3d 57° C. | 3 | 11 |
|   | 4d 57° C. | 4 | 11 |

[a],[b]see table 2

Evaluation:

It is clear that imaging elements 1 (comparative element) shows a bad storage stability. After keeping it for 3 days at 57° C., it can not more be developed what means that no more image can be formed on the plate after image-wise exposure and development with plain water, the plate being completely and heavily fogged. On the other hand, imaging elements 5, 6 and 7 (imaging elements according to the invention) after keeping them for 3 and even 4 days at 57° C. show only a moderate loss in developability and no fog. Imaging element 7 with the highest amount on diazo resin according to the invention FAIRMOUNT No 8 shows even slightly better results for developability than imaging element 5 and 6. The sensitivity of the imaging elements 5, 6 and 7 is only very slightly lower than the sensitivity of the imaging element 1.

EXAMPLE 3

Imaging element 1 was prepared, stored, exposed and developed as described in example 1.

Imaging elements 8, 9, 10 and 11 were prepared, stored, exposed and developed in an identical way as imaging element 1 with the exception that the diazo resin NEGALUX N 11 was replaced for 10% (imaging element 8), by 20% (imaging element 9), by 30% (imaging element 10) and by 40% (imaging element 11) by weight of 3 MDS (3-methoxy-diphenylamine-4-diazonium hydrogensulfate salt, sold by Siber Hegner). The obtained results are shown in table 4.

TABLE 4

| Material | Storage conditions | Dev.ᵃ | Fogᵇ |
|---|---|---|---|
| 1 | fresh | 2 | 11 |
|   | 2,5d 57° C. | 5 | 6,5 |
|   | 3,5d 57° C. | 13 | 0 |
| 8 | fresh | 2 | 11 |
|   | 2,5d 57° C. | 5 | 6,5 |
|   | 3,5d 57° C. | 13 | 0 |
| 9 | fresh | 2 | 11 |
|   | 2,5d 57° C. | 4,5 | 7,5 |
|   | 3,5d 57° C. | 9 | 5 |
| 10 | fresh | 2 | 11 |
|   | 2,5d 57° C. | 4 | 8 |
|   | 3,5d 57° C. | 6 | 6 |
| 11 | fresh | 2 | 11 |
|   | 2,5d 57° C. | 4 | 8 |
|   | 3,5d 57° C. | 5 | 6 |

ᵃ,ᵇ: see table 2

Evaluation:

It is clear that imaging elements 1 and 8 (comparative elements) show low storage stability. After keeping them for 3 days at 57° C., they can not more be developed what means that no more image can be formed on the plate after image-wise exposure and development with plain water, the plate being completely and heavily fogged. Imaging element 9 (comparative element) is a borderline case. It can still be developed, although only barely and the fog is in fact unacceptable. Imaging elements 10 and 11 (imaging element according to the invention) after keeping them for 3 days at 57° C. are well developable and with a fog level that is better than that of imaging element 9 (comparison element). The sensitivity of the imaging elements 10 and 11 is only very slightly lower than the sensitivity of the imaging element 1.

EXAMPLE 4

Imaging element 2, 3, 5, 7 and 11 were prepared as described in the previous examples.

Imaging elements 12 and 13 were prepared in an identical way as imaging element 1 with the exception that the diazo resin NEGALUX N 11 was replaced for 45% by weight of DIAZO No 8 (imaging element 12) or for 45% by weight of 3 MDS (imaging element 13).

These imaging elements were exposed through a wedge containing fine lines and developed in an identical way as described in example 1.

The printing plates II, III, V, VII, XI, XII and XIII so obtained were mounted on the same offset printing machine (HEIDELBERG GTO-46) and were used for printing under identical conditions. Commercial Rotomatic 100 was used as dampening solution and K+E 125, marketed by Kast and Ehinger, A. G., Germany as ink. A non-compressible rubber blanket was used.

The printing endurance of these printing plates, expressed as the smallest line that is still printed after 3000 copies is given in table 5.

TABLE 5

| Printing plate | Printing endurance |
|---|---|
| II | 2 μm |
| III | 3 μm |
| V | 2 μm |
| VII | 10 μm |
| XI | 10 μm |
| XII | 45 μm |
| XIII | 50 μm |

It is clear from these results that printing plates obtained from imaging elements comprising as diazo resin Negalux N 11, whereby said Negalux N 11 is replaced for 10% (printing plate II), for 20% (printing plate III), for 30 % (printing plate V) or for 40% (printing plate VII) by weight by DIAZO No 8 or for 40% by weight by 3 MDS (printing plate XI) show a good to a very good printing endurance. Indeed there disappear no lines (printing plates II, III, V) or only the very small lines (printing plates VII and IX) by printing till 3000 copies.

Printing plates obtained from imaging elements comprising as diazo resin Negalux N 11, whereby said Negalux N 11 is replaced for 45% (printing plate XII) by weight by DIAZO No 8 or for 45% by weight by 3 MDS (printing plate XIII) show a low printing endurance. Indeed, most lines except the very broad ones are disappeared by printing till 3000 copies.

We claim:

1. An imaging element comprising on a support in the order given a hydrophilic layer containing a hydrophilic (co)polymer or (co)polymer mixture and having been hardened with a hydrolyzed tetraalkyl orthosilicate and a light sensitive layer containing at least two diazo compounds characterized in that the light sensitive layer comprises at least one diazo resin or diazonium salt which is a diazonium salt of p-aminodiphenylamine containing as a substituent an alkyl or alkoxy group and the weight percentage of said diazonium salt(s) and/or diazo resin(s) which is a diazonium salt of p-aminodiphenylamine containing as a substituent an alkyl or alkoxy group versus the total amount of said at least two diazo compounds ranges from 22 to 40%.

2. An imaging element according to claim 1 wherein said substituent contains 1 or 2 carbon atoms.

3. An imaging element according to claim 1 wherein said substituent is an alkoxy group.

4. An imaging element according to claim 1 wherein said diazo resin or diazonium salt containing or being a diazonium salt of p-aminodiphenylamine containing as substituent an alkyl or alkoxy group is a 3-methoxy-diphenylamine-4-diazonium salt.

5. An imaging element according to claim 1 wherein said diazo resin or diazonium salt containing or being a diazonium salt of p-aminodiphenylamine containing as substituent an alkyl or alkoxy group is a condensation product of formaldehyde with a 3-methoxydiphenylamine-4-diazonium salt.

6. An imaging element according to claim 1 wherein the weight percentage of said diazonium salts and/or diazo resins containing or being a diazonium salt of p-aminodiphenylamine containing as substituent an alkyl or alkoxy group versus the total amount of diazo resin and/or diazonium salt ranges from 25% to 35%.

7. An imaging element according to claim 1 wherein a subbing layer is coated between the support and the hydrophilic layer comprising a hydrophilic binder and silica.

8. An imaging element according to claim 1 wherein there is provided an intermediate layer containing an organic compound having cationic groups between said hydrophilic layer and said light sensitive layer.

9. An imaging element according to claim 1 wherein said light sensitive layer contains a polyvinylacetate hydrolysed to an extent of at least 95% by weight as a hydrophilic binder and further a cationic fluor containing surfactant.

10. A method for making a lithographic printing plate comprising the steps of image-wise exposing an imaging element as defined in claim 1 and subsequently developing a thus obtained image-wise exposed imaging element by means of rinsing with an aqueous liquid.

* * * * *